(12) United States Patent
Shen et al.

(10) Patent No.: US 10,928,942 B2
(45) Date of Patent: Feb. 23, 2021

(54) DISPLAY SUBSTRATE, MANUFACTURING METHOD THEREOF, DISPLAY PANEL AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Can Shen, Beijing (CN); Zhicai Xu, Beijing (CN); Bo Xu, Beijing (CN); Xinghong Liu, Beijing (CN); Shuai Hou, Beijing (CN); Bo Ran, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 120 days.

(21) Appl. No.: 16/328,410

(22) PCT Filed: Jun. 7, 2018

(86) PCT No.: PCT/CN2018/090177
§ 371 (c)(1),
(2) Date: Feb. 26, 2019

(87) PCT Pub. No.: WO2019/037513
PCT Pub. Date: Feb. 28, 2019

(65) Prior Publication Data
US 2020/0356201 A1    Nov. 12, 2020

(30) Foreign Application Priority Data
Aug. 25, 2017   (CN) .......................... 201710741195.9

(51) Int. Cl.
*G06F 3/041* (2006.01)
*H01L 27/12* (2006.01)

(52) U.S. Cl.
CPC .......... *G06F 3/0412* (2013.01); *H01L 27/124* (2013.01); *H01L 27/1251* (2013.01); *H01L 27/1259* (2013.01)

(58) Field of Classification Search
CPC . G06F 3/0412; H01L 27/1259; H01L 27/124; H01L 27/1251
See application file for complete search history.

(56) References Cited

U.S. PATENT DOCUMENTS 8,884,919 B2 * 11/2014 Sogabe ................. G06F 3/0445
345/174
2006/0279676 A1   12/2006 Masutani et al.
(Continued)

FOREIGN PATENT DOCUMENTS

| CN | 1881014 A | 12/2006 |
|---|---|---|
| CN | 101796619 A | 8/2010 |

(Continued)

OTHER PUBLICATIONS

First Office Action and English language translation, CN Application No. 201710741195.9, dated Jul. 2, 2019, 9 pp.
(Continued)

*Primary Examiner* — Vinh T Lam
(74) *Attorney, Agent, or Firm* — Myers Bigel, P.A.

(57) ABSTRACT

The present disclosure relates to the field of display technology, and provides a display substrate, a manufacturing method thereof, a display panel, and a display device. The display substrate includes a base substrate, a plurality of gate lines on the base substrate, a film structure on a side of the plurality of gate lines away from the base substrate, and a plurality of conductive lines on a side of the film structure
(Continued)

away from the base substrate. In the display substrate, an orthographic projection of each gate line on the base substrate at least partially overlaps with an orthographic projection of a corresponding conductive line on the base substrate, and a signal transmitted on each conductive line is inverted from a signal transmitted on a corresponding gate line.

16 Claims, 4 Drawing Sheets

(56) References Cited

U.S. PATENT DOCUMENTS

| | | | |
|---|---|---|---|
| 2008/0079006 A1 | 4/2008 | Park et al. | |
| 2010/0193793 A1 | 8/2010 | Moriwaki | |
| 2014/0056400 A1* | 2/2014 | Koyama | H01L 27/1225 377/78 |
| 2015/0102288 A1* | 4/2015 | Hersam | H01L 51/107 257/29 |
| 2016/0154515 A1* | 6/2016 | Mu | G06F 3/04166 345/174 |
| 2016/0188100 A1* | 6/2016 | Teranishi | G06F 3/044 345/174 |
| 2016/0202835 A1* | 7/2016 | Mizuhashi | G06F 3/0412 345/174 |
| 2016/0240564 A1* | 8/2016 | Sunamura | H01L 29/812 |
| 2016/0284740 A1* | 9/2016 | Kimura | H01L 27/1255 |
| 2018/0260058 A1* | 9/2018 | Zhan | G06F 3/047 |

FOREIGN PATENT DOCUMENTS

| | | |
|---|---|---|
| CN | 102956214 A | 3/2013 |
| CN | 103257498 A | 8/2013 |
| CN | 107527925 A | 12/2017 |
| JP | 2001-44442 A | 2/2001 |
| KR | 10-2008-0030210 A | 4/2008 |

OTHER PUBLICATIONS

International Search Report and Written Opinion of the International Searching Authority (with English language translation of Written Opinion), International Application No. PCT/CN2018/090177, dated Aug. 21, 2018, 12 pp.

* cited by examiner

DISPLAY SUBSTRATE, MANUFACTURING METHOD THEREOF, DISPLAY PANEL AND DISPLAY DEVICE

CROSS REFERENCE TO RELATED APPLICATIONS

The present application is a 35 U.S.C. 371 national stage application of PCT International Application No. PCT/CN2018/090177, filed on Jun. 7, 2018, which claims the benefit of Chinese Patent Application No. 201710741195.9 filed on Aug. 25, 2017, the contents of which are incorporated herein by reference in their entireties.

RELATED APPLICATION(S)

Technical Field

The present disclosure relates to the field of display technology, in particular to a display substrate, a manufacturing method thereof, a display panel and a display device.

Background

For a typical display device, when displaying an image, it is generally required to perform a progressive scan of a plurality of rows of pixel units in the display panel by a gate driving circuit. Specifically, each pixel unit includes a driving transistor and a pixel electrode, and the driving transistors located in the same row of pixel units are connected to one gate line. When the gate driving circuit outputs a gate driving signal to a gate line, the driving transistors in a row of pixel units connected to this gate line may be turned on due to such a driving signal, thereby charging the pixel electrodes.

In related arts, a driving signal outputted from a gate driving circuit to each gate line is generally a clock signal. Since the voltage difference between high level and low level of the clock signal is relative large, when the clock signal jumps in level, the gate line voltage changes greatly, and coupling noise is often incurred on the surface of the display panel.

Currently, the display panel is generally a touch display panel integrated with a touch function. When the touch signal is detected by using the touch display panel, the detection may be interfered by the coupling noise on the surface of the touch display panel, thereby affecting the touch precision of the touch display panel.

SUMMARY

According to an aspect of the present disclosure, a display substrate is provided. Specifically, the display substrate includes: a base substrate; a plurality of gate lines on the base substrate; a film structure on a side of the plurality of gate lines away from the base substrate; and a plurality of conductive lines on a side of the film structure away from the base substrate. Further, an orthographic projection of each gate line on the base substrate at least partially overlaps with an orthographic projection of a corresponding conductive line on the base substrate, and a signal transmitted on each conductive line is inverted from a signal transmitted on a corresponding gate line.

According to a specific implementation, the display substrate provided by an embodiment of the present disclosure further includes a plurality of inverters. Specifically, an input of each inverter is connected to a gate line, an output of each inverter is connected to a conductive line, and orthographic projections on the base substrate of the gate line and the conductive line that are connected to a same inverter at least partially overlap with each other.

According to a specific implementation, in the display substrate provided by an embodiment of the present disclosure, the orthographic projection of each gate line on the base substrate coincides with the orthographic projection of the corresponding conductive line on the base substrate.

According to a specific implementation, in the display substrate provided by an embodiment of the present disclosure, each inverter includes an N-type transistor and a P-type transistor. Specifically, a gate of the N-type transistor and a gate of the P-type transistor are connected to a same gate line, a first pole of the P-type transistor is connected to a first power line, a first pole of the N-type transistor is connected to a second power line, and a second pole of the N-type transistor and a second pole of the P-type transistor are connected to a same conductive line. Further, the first power line is supplied with a first power signal of a first potential, the second power line is supplied with a second power signal of a second potential, and the first potential is a higher potential relative to the second potential.

According to a specific implementation, in the display substrate provided by an embodiment of the present disclosure, the N-type transistor and the P-type transistor are both thin film transistors.

According to a specific implementation, in the display substrate provided by an embodiment of the present disclosure, each inverter includes a gate pattern layer, a gate insulating layer, an active layer, and a source-drain pattern layer sequentially disposed on the base substrate. The gate pattern layer is configured to serve as gates of the N-type transistor and the P-type transistor. The active layer includes an N-type semiconductor pattern and a P-type semiconductor pattern that are spaced apart from each other. The source-drain pattern layer includes a first source pattern, a second source pattern, and a drain pattern that are spaced apart from each other, wherein the first source pattern is configured to serve as the first pole of the N-type transistor, the second source pattern is configured to serve as the first pole of the P-type transistor, and the drain pattern is configured to serve as the second poles of the N-type transistor and the P-type transistor. The gate pattern layer is electrically connected to a gate line, the first source pattern is electrically connected to the second power line, the second source pattern is electrically connected to the first power line, and the drain pattern is electrically connected to a conductive line.

According to a specific implementation, in the display substrate provided by an embodiment of the present disclosure, an orthographic projection of the first source pattern on the base substrate at least partially overlaps with an orthographic projection of the N-type semiconductor pattern on the base substrate. An orthographic projection of the second source pattern on the base substrate at least partially overlaps with an orthographic projection of the P-type semiconductor pattern on the base substrate. An orthographic projection of the drain pattern on the base substrate at least partially overlaps with the orthographic projection of the N-type semiconductor pattern on the base substrate and the orthographic projection of the P-type semiconductor pattern on the base substrate. Furthermore, an orthographic projection of the gate pattern layer on the base substrate at least partially overlaps with the orthographic projection of the N-type semiconductor pattern on the base substrate and the orthographic projection of the P-type semiconductor pattern on the base substrate.

According to a specific implementation, in the display substrate provided by an embodiment of the present disclosure, each inverter is disposed at an end of the corresponding gate line for connecting to the gate driving circuit.

According to a specific implementation, in the display substrate provided by an embodiment of the present disclosure, the film structure includes a plurality of driving thin film transistors.

According to a specific implementation, the display substrate provided by an embodiment of the present disclosure further includes: a driving circuit for the plurality of conductive lines. Specifically, the driving circuit is configured to transmit on each conductive line a signal inverted from a signal transmitted on the corresponding gate line.

According to another aspect of the present disclosure, a manufacturing method for a display substrate is also provided. Specifically, the manufacturing method includes the steps of: forming a plurality of gate lines on a base substrate; forming a film structure on a side of the plurality of gate lines away from the base substrate; and forming a plurality of conductive lines on a side of the film structure away from the base substrate. In addition, an orthographic projection of each gate line on the base substrate at least partially overlaps with an orthographic projection of a corresponding conductive line on the base substrate, and a signal transmitted on each conductive line is inverted from a signal transmitted on a corresponding gate line.

According to a specific implementation, the manufacturing method for a display substrate provided by an embodiment of the present disclosure further includes a step of forming a plurality of inverters on the base substrate. Specifically, an input of each inverter is connected to a gate line, an output of each inverter is connected to a conductive line, and orthographic projections on the base substrate of the gate line and the conductive line that are connected to a same inverter at least partially overlap with each other.

According to a specific implementation, in the manufacturing method for a display substrate provided by an embodiment of the present disclosure, the step of forming a plurality of conductive lines on a side of the film structure away from the base substrate includes: forming the plurality of conductive lines on a side of the film structure away from the base substrate by using a mask for forming the plurality of gate lines.

According to a specific implementation, in the manufacturing method for a display substrate provided by an embodiment of the present disclosure, each inverter includes an N-type transistor and a P-type transistor. In this case, the step of forming a plurality of inverters on the base substrate includes: forming a plurality of sets of transistors on the base substrate, wherein each set of transistors includes an N-type transistor and a P-type transistor. Further, a gate of the N-type transistor and a gate of the P-type transistor in each set of transistors are connected to a same gate line, a first pole of the P-type transistor in each set of transistors is connected to a first power line, a first pole of the N-type transistor in each set of transistors is connected to a second power line, and a second pole of the N-type transistor and a second pole of the P-type transistor in each set of transistors are connected to a same conductive line. Further, the first power line is supplied with a first power signal of a first potential, the second power line is supplied with a second power signal of a second potential, and the first potential is a higher potential relative to the second potential.

According to a specific implementation, in the manufacturing method for a display substrate provided by an embodiment of the present disclosure, the N-type transistor and the P-type transistor are both thin film transistors. In this case, the step of forming a plurality of sets of transistors on the base substrate includes: forming the plurality of sets of transistors in synchronization with formation of the driving thin film transistors.

According to a specific implementation, in the manufacturing method for a display substrate provided by an embodiment of the present disclosure, each set of transistors is formed by the following steps: forming a gate pattern layer on the base substrate, such that the gate pattern layer is electrically connected to a gate line and serves as gates of the N-type transistor and the P-type transistor; forming a gate insulating layer and an active layer sequentially on a side of the gate pattern layer away from the base substrate, the active layer including an N-type semiconductor pattern and a P-type semiconductor pattern that are spaced apart from each other; and forming a source-drain pattern layer on a side of the active layer away from the base substrate, the source-drain pattern layer including a first source pattern, a second source pattern, and a drain pattern that are spaced apart from each other. Specifically, the first source pattern is electrically connected to the second power line, the second source pattern is electrically connected to the first power line, and the drain pattern is electrically connected to a conductive line. Further, the first source pattern is formed to serve as a first pole of the N-type transistor, the second source pattern is formed to serve as a first pole of the P-type transistor, and the drain pattern is formed to serve as second poles of the N-type transistor and the P-type transistor.

According to a specific implementation, in a manufacturing method for a display substrate provided by an embodiment of the present disclosure, the first source pattern is formed such that an orthographic projection thereof on the base substrate at least partially overlaps with an orthographic projection of the N-type semiconductor pattern on the base substrate. Further, the second source pattern is formed such that an orthographic projection thereof on the base substrate at least partially overlaps with an orthographic projection of the P-type semiconductor pattern on the base substrate. In addition, the drain pattern is formed such that an orthographic projection thereof on the base substrate at least partially overlaps with the orthographic projection of the N-type semiconductor pattern on the base substrate and the orthographic projection of the P-type semiconductor pattern on the base substrate. Similarly, the gate pattern layer is formed such that an orthographic projection thereof on the base substrate at least partially overlaps with the orthographic projection of the N-type semiconductor pattern on the base substrate and the orthographic projection of the P-type semiconductor pattern on the base substrate.

According to a specific implementation, the manufacturing method for a display substrate provided by an embodiment of the present disclosure further includes the following steps: providing a driving circuit for the plurality of conductive lines, such that each conductive line transmits a signal inverted from a signal transmitted on the corresponding gate line.

According to yet another aspect of the present disclosure, a display panel is also provided. Specifically, the display panel includes the display substrate as described in any of the preceding embodiments.

According to still another aspect of the present disclosure, a display device is also provided. Specifically, the display device includes the display panel as described in any of the preceding embodiments.

BRIEF DESCRIPTION OF THE DRAWINGS

In order to illustrate the technical solutions in embodiments of the present disclosure more clearly, the appended drawings needed to be used in the description of embodiments will be introduced briefly in the following. Obviously, the drawings in the following description are only some embodiments of the present disclosure, and for those of ordinary skills in the art, other embodiments can be obtained according to these drawings under the premise of not paying out creative work.

FIG. 6-1 is a flowchart of a manufacturing method for a display substrate according to an embodiment of the present disclosure;

FIG. 6-2 is a flowchart for forming a set of transistors on a base substrate according to an embodiment of the present disclosure;

FIG. 6-3 is a schematic diagram of a structure after forming a gate insulating layer and an active layer sequentially on a side of a gate pattern layer away from a base substrate according to an embodiment of the present disclosure; and FIG. 6-4 is a schematic diagram of a structure after forming a source-drain pattern layer on a side of an active layer away from a base substrate according to an embodiment of the present disclosure.

DETAILED DESCRIPTION OF THE EMBODIMENTS

In order to illustrate objects, technical solutions and advantages of the present disclosure more clearly, in the following, implementations of the present disclosure will be described in further details with reference to the drawings.

Figure 1:
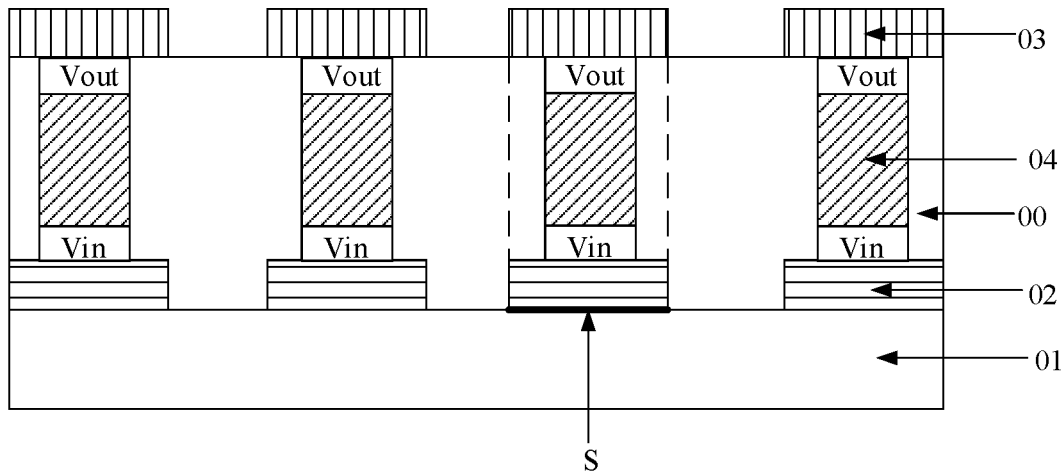
FIG. 1 is a schematic structural diagram of a display substrate according to an embodiment of the present disclosure.

FIG. 1 is a schematic diagram of a display substrate according to an embodiment of the present disclosure. As shown in FIG. 1, the display substrate may include a plurality of gate lines 02 disposed on a base substrate 01. Further, a film structure 00 is disposed on a side of the plurality of gate lines 02 away from the base substrate 01. Optionally, the film structure 00 may include a plurality of driving thin film transistors for driving the pixel electrodes. In addition, a plurality of conductive lines 03 are further disposed on a side of the film structure 00 away from the base substrate 01. Specifically, an orthographic projection of each gate line 02 on the base substrate 01 overlaps with an orthographic projection (shown by a thick solid line S in FIG. 1) of a corresponding conductive line 03 on the base substrate 01. Generally, the orthographic projection of each conductive line 03 on the base substrate 01 overlaps only with the orthographic projection of one gate line 02, so as to avoid a larger coupling noise caused by overlapping between the orthographic projection of the conductive line 03 on the base substrate 01 and orthographic projections of other gate lines 02 on the base substrate 01.

Figure 2:
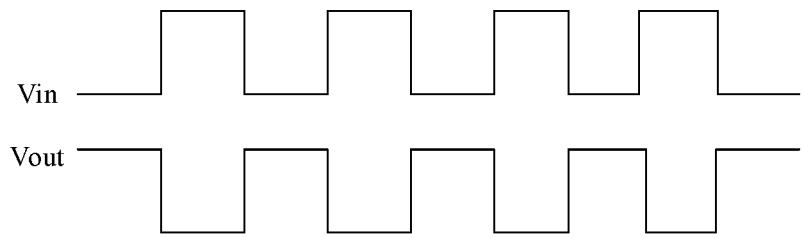
FIG. 2 is a schematic timing diagram of a transmission signal in a display substrate according to an embodiment of the present disclosure.

As shown in FIG. 2, if a signal $V_{in}$ for transmitting on the gate line 02 is a clock signal, a signal $V_{out}$ for transmitting on the conductive line 03 can also be a clock signal, in particular, a clock signal inverted from the signal $V_{in}$. Moreover, those skilled in the art will appreciate that the plurality of gate lines can be arranged in an array. This means that the plurality of conductive lines can be also arranged in an array.

In summary, according to embodiments of the present disclosure, a display substrate is provided. Specifically, by disposing a plurality of conductive lines and a plurality of gate lines on the base substrate, and inverting the signal transmitted on each conductive line from the signal transmitted on the corresponding gate line, the coupling noise generated on the display panel due to the driving signal transmitted on the gate lines can be cancelled. In addition, according to an embodiment of the present disclosure, the provided display substrate can also be applied to a touch display panel. In this case, since the coupling noise on the surface of the panel has been reduced, the interference of the touch signal received by the touch display panel due to the coupling noise can be effectively reduced, thereby improving the touch precision of the touch display panel.

Optionally, as shown in FIG. 1, the display substrate may further include a plurality of inverters 04.

Specifically, an input of each inverter 04 is connected to a gate line 02, and an output of each inverter 04 is connected to a conductive line 03. Further, orthographic projections on the base substrate 01 (shown by the thick solid line S in FIG. 1) of the gate line 02 and the conductive line 03 that are connected to the same inverter 04 overlap with each other. Here, it should be noted that the expression of "orthographic projections on the base substrate 01 of the gate line 02 and the conductive line 03 that are connected to the same inverter 04 overlap with each other" may mean a partial overlap or a complete overlap. Such an interpretation applies equally to the term of "overlap" as appeared anywhere else in the present disclosure.

It should be noted that, in an embodiment of the present disclosure, the number of inverters 04 and the number of conductive lines 03 are equal, that is, both equal to the number of gate lines 02. In addition, the plurality of inverters 04 is also connected in one-to-one correspondence with the plurality of gate lines 02, and at the same time, connected in one-to-one correspondence with the plurality of conductive lines 03.

Here, it should be noted that although each inverter 04 is shown in FIG. 1 to be sandwiched between the corresponding gate line 02 and conductive lines 03, this does not indicate any limitation to the present disclosure. In fact, those skilled in the art should contemplate any suitable position for the plurality of inverters 04 based on teachings of the present disclosure, as long as the corresponding gate lines 02 and conductive lines 03 can be electrically connected to the inverters 04 respectively. That is, the arrangement of inverters 04 shown in FIG. 1 is merely an exemplary arrangement for achieving objectives of the present disclosure, which may for example present advantages such as facilitating formation, simplifying processes, reducing costs, etc.

Further, as shown in FIG. 1, orthographic projections on the base substrate 01 of the gate line 02 and the conductive line 03 that are connected to the same inverter 04 may completely coincide. That is, the width and the arrangement direction of each conductive line 03 are exactly the same with that of the corresponding gate line 02. Moreover, the conductive lines 03 may be formed by using a conductive material for forming the gate lines 02. For example, the conductive lines 03 and the gate lines 02 may both be formed of a metal material. Therefore, it can be ensured that the coupling noise generated by the signal transmitted on the corresponding gate line 02 can be completely cancelled by the signal transmitted on the conductive line 03, thereby effectively improving the touch precision of the touch panel.

Figure 3:
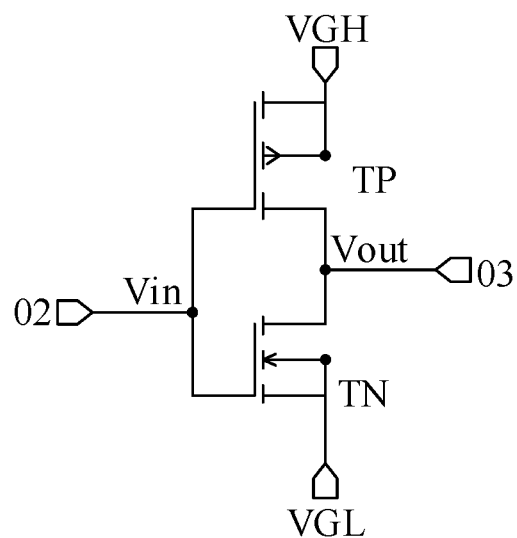
FIG. 3 is a schematic diagram showing an equivalent circuit of an inverter in a display substrate according to an embodiment of the present disclosure.

Referring to FIG. 3, an equivalent circuit diagram of an inverter 04 according to an embodiment of the present disclosure is schematically illustrated. As shown in FIG. 3, the inverter 04 may include an N-type transistor TN and a P-type transistor TP.

Specifically, a gate of the N-type transistor TN and a gate of the P-type transistor TP are connected to a same gate line 02, a first pole of the P-type transistor TP is connected to a first power line VGH, a first pole of the N-type transistor TN is connected to a second power line VGL, and a second pole of the N-type transistor TN and a second pole of the P-type transistor TP are connected to a same conductive line 03. In addition, the first power line VGH may be supplied with a first power signal of a first potential V1, and the second power line VGL may be supplied with a second power signal of a second potential V2, wherein the first potential V1 is a higher potential relative to the second potential V2. As an example, for each of the above mentioned transistors, the first pole can be a source and the second pole can be a drain. Of course, in other embodiments, for each transistor, the first pole can be a drain and the second pole can be a source.

As can be seen from FIG. 3, the gates of the N-type transistor TN and the P-type transistor TP constitute an input of the inverter 04 (on which the signal $V_{in}$ is input), and the second poles of the N-type transistor TN and the P-type transistor TP constitute an output of inverter 04 (which is used to output signal $V_{out}$).

It is assumed that the signal $V_{in}$ supplied from the gate line 02 to the input of the inverter 04 has a high potential V1. In this case, since the potential at the source of the P-type transistor TP is the first potential V1 supplied from the first power line VGH, the gate-source voltage difference Vgs1 of the P-type transistor TP satisfies the equation of Vgs1=V1−V1=0, thereby causing the P-type transistor TP to be turned off. Meanwhile, since the potential at the source of the N-type transistor TN is the second potential V2 supplied from the second power line VGL, the gate-source voltage difference Vgs2 of the N-type transistor TN satisfies the equation of Vgs2=V1−V2>Vth (where Vth is the threshold voltage of the N-type transistor TN), thereby causing the N-type transistor TN to be turned on. In such a case, conduction is enabled between the output of the inverter 04 and the second power line VGL, so that the signal $V_{out}$ supplied from its output to the conductive line 03 will have the second potential V2 supplied from the second power line VGL. Obviously, the second potential V2 is inverted from the potential V1 of the signal provided by the gate line 02.

It is assumed that the signal $V_{in}$ supplied from the gate line 02 to the input of the inverter 04 has a low potential V2. In this case, since the potential at the source of the P-type transistor TP is the first potential V1 supplied from the first power line VGH, the gate-source voltage difference Vgs1 of the P-type transistor TP satisfies the equation of Vgs1=V2−V1<0, thereby causing the P-type transistor TP to be turned on. Meanwhile, since the potential at the source of the N-type transistor TN is the second potential V2 supplied from the second power line VGL, the gate-source voltage difference Vgs2 of the N-type transistor TN satisfies the equation of Vgs2=V2−V2=0, thereby causing the N-type transistor TN to be turned off. In such a case, conduction is enabled between the output of the inverter 04 and the first power line VGH, so that the signal $V_{out}$ supplied from its output to the conductive line 03 will have the first potential V1 supplied from the first power line VGH. Obviously, the first potential V1 is inverted from the potential V2 of the signal provided by the gate line 02.

In an embodiment of the present disclosure, each inverter 04 may be disposed at an end of the gate line 02 for connecting to the gate driving circuit, wherein the gate driving circuit is used to provide each gate line 02 with a driving signal. Therefore, the end of the gate line 02 for connecting to the gate driving circuit is also the input of the gate line 02. By disposing the inverter 04 at the input of the gate line 02, the inverter 04 can promptly output an inverted signal to the corresponding conductive line 03 when the gate driving circuit outputs a driving signal to the gate line 02. Thereby, it is ensured that the coupling noise generated by the signal transmitted on the gate line 02 is reduced timely.

Of course, the inverter 04 can also be disposed at the other end of the gate line 02, that is, the end away from the connection end between the gate line 02 and the gate driving circuit, and embodiments of the present disclosure are not limited in this regard.

It should be noted that since the film structure 00 further includes driving thin film transistors for driving the pixel electrodes, the N-type transistor TN and the P-type transistor TP may also be selected as thin film transistors. Thus, the inverters 04 can be formed in synchronization with the driving thin film transistors in the original structure, thereby reducing the manufacturing difficulty of the display substrate.

Figure 4:
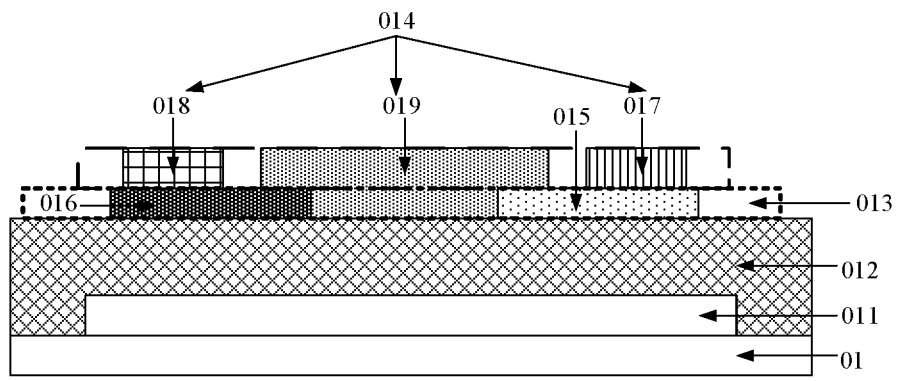
FIG. 4 is a schematic diagram showing a film structure of an inverter in a display substrate according to an embodiment of the present disclosure.

FIG. 4 is a schematic diagram showing a film structure of an inverter 04 according to an embodiment of the present disclosure. As shown in FIG. 4, the film structure of the inverter 04 may include a gate pattern layer 011, a gate insulating layer 012, an active layer 013 and a source-drain pattern layer 014 disposed sequentially on the base substrate 01. Specifically, the gate pattern layer 011 serves as gates of the N-type transistor TN and the P-type transistor TP. Further, the active layer 013 includes an N-type semiconductor pattern 015 and a P-type semiconductor pattern 016 that are spaced apart from each other, and the source-drain pattern layer 014 includes a first source pattern 017, a second source pattern 018, and a drain pattern 019 that are spaced apart from each other. The first source pattern 017 serves as a first pole of the N-type transistor TN, the second source pattern 018 serves as a first pole of the P-type transistor TP, and the drain pattern 019 serves as second poles of the N-type transistor TN and the P-type transistor TP.

Figure 5:
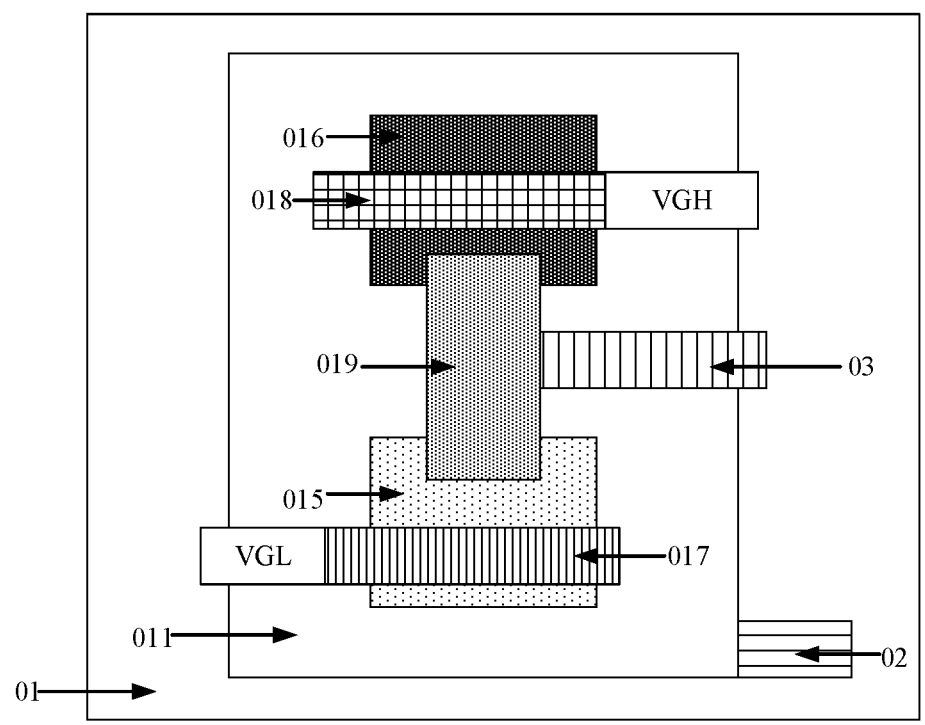
FIG. 5 is a plan view showing a film structure of an inverter in a display substrate according to an embodiment of the present disclosure.

FIG. 5 is a plan view showing a film structure of an inverter 04 according to an embodiment of the present disclosure. As shown in FIG. 5, the gate pattern layer 011 is electrically connected to a gate line 02, the first source pattern 017 is electrically connected to the second power line VGL, the second source pattern 018 is electrically connected to the first power line VGH, and the drain pattern 019 is electrically connected to a conductive line 03.

Referring also to FIG. 5, it can be seen that the orthographic projection of the first source pattern 017 on the base substrate 01 overlaps with the orthographic projection of the N-type semiconductor pattern 015 on the base substrate 01. That is, the first source pattern 017 is in contact with the N-type semiconductor pattern 015. Moreover, the orthographic projection of the second source pattern 018 on the base substrate 01 overlaps with the orthographic projection of the P-type semiconductor pattern 016 on the base substrate 01. That is, the second source pattern 018 is in contact with the P-type semiconductor pattern 016. In addition, the orthographic projection of the drain pattern 019 on the base substrate 01 overlaps with the orthographic projection of the N-type semiconductor pattern 015 on the base substrate 01 and the orthographic projection of the P-type semiconductor pattern 016 on the base substrate 01. That is, the drain pattern 019 is in contact with the N-type semiconductor pattern 015, and is also in contact with the P-type semiconductor pattern 016. Further, the orthographic projection of the gate pattern layer 011 on the base substrate 01 overlaps with the orthographic projection of the N-type semiconductor pattern 015 on the base substrate 01 and the orthographic projection of the P-type semiconductor pattern 016 on the base substrate. That is, the gate pattern layer 011 is in contact with the N-type semiconductor pattern 015 and is also in contact with the P-type semiconductor pattern 016.

Referring to FIG. 3 to FIG. 5, it can also be seen that in the inverter 04, the gate pattern layer 011, the gate insulating layer 012, the P-type semiconductor pattern 016, the second source pattern 018, and the drain pattern 019 constitute together a P-type transistor TP. Correspondingly, the gate pattern layer 011, the gate insulating layer 012, the N-type semiconductor pattern 015, the first source pattern 017, and the drain pattern 019 constitute together an N-type transistor TN. Specifically, the P-type transistor TP and the N-type transistor TN may share one gate pattern layer 011 as its gate, and may share one drain pattern 019 as its second pole (e.g., its drain). Further, the second source pattern 018 is the first pole (e.g., the source) of the P-type transistor TP, and the first source pattern 017 is the first pole (e.g., the source) of the N-type transistor TN.

Herein, it should be noted that although as an example in the above embodiments, the inverter is used to invert the signal transmitted on the gate line and guide the inverted signal to the conductive line, the present disclosure is not limited only to it. For example, in alternative embodiments, a separate driving circuit can also be used to provide the plurality of conductive lines with signals that are inverted from those signals on the corresponding gate lines. That is to say, according to such an embodiment, in the resulting display substrate or display panel, there will be two different driving circuits for driving a plurality of gate lines and a plurality of conductive lines respectively. As an example, a gate driving circuit for gate lines can be provided to enable transmission of a first signal on a plurality of gate lines, and in the meantime, another driving circuit for conductive lines can be provided to enable transmission of a second signal on a plurality of conductive lines, wherein the first signal and the second signal are inverted. In addition, it should be noted that, based on teachings of the present disclosure, those skilled in the art should be able to flexibly select various deployment positions of the driving circuit for a plurality of conductive lines according to actual needs, as long as the driving circuit can drive a plurality of conductive lines to transmit signals inverted from those on the corresponding gate lines respectively. Accordingly, the present disclosure is intended to cover all of these possible deployment positions of the driving circuit that is suitable for the plurality of conductive lines.

In summary, embodiments of the present disclosure provide a display substrate. Specifically, by disposing a plurality of conductive lines and a plurality of gate lines on the base substrate, and inverting the signal transmitted on each conductive line from the signal transmitted on the corresponding gate line, the coupling noise generated on the display panel due to the driving signal transmitted on the gate lines can be cancelled. In addition, the display substrate can also be applied to a touch display panel. In this case, since the coupling noise on the surface of the panel has been reduced, the interference of the touch signal received by the touch display panel due to the coupling noise can be effectively reduced, thereby improving the touch precision of the touch display panel.

Figures 1, 6:
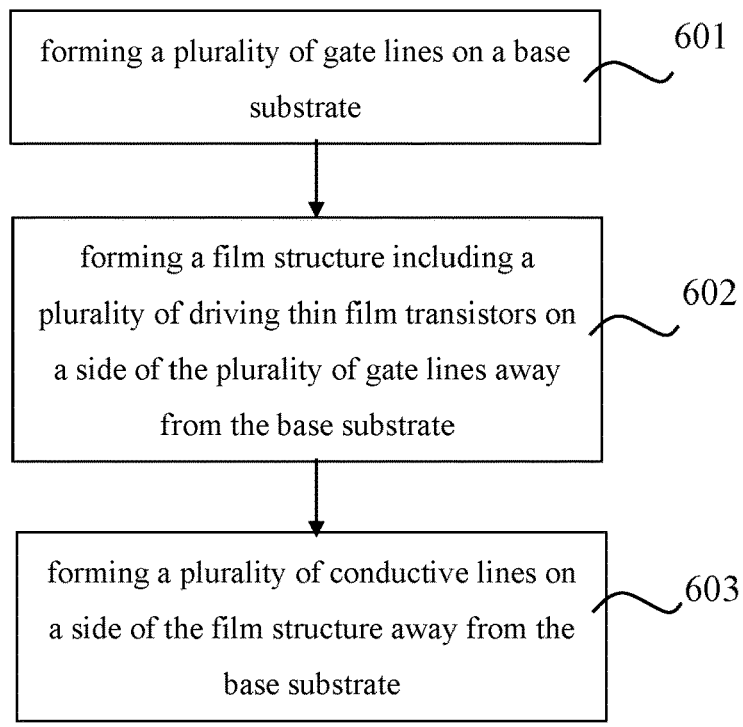
Figures 2, 6:
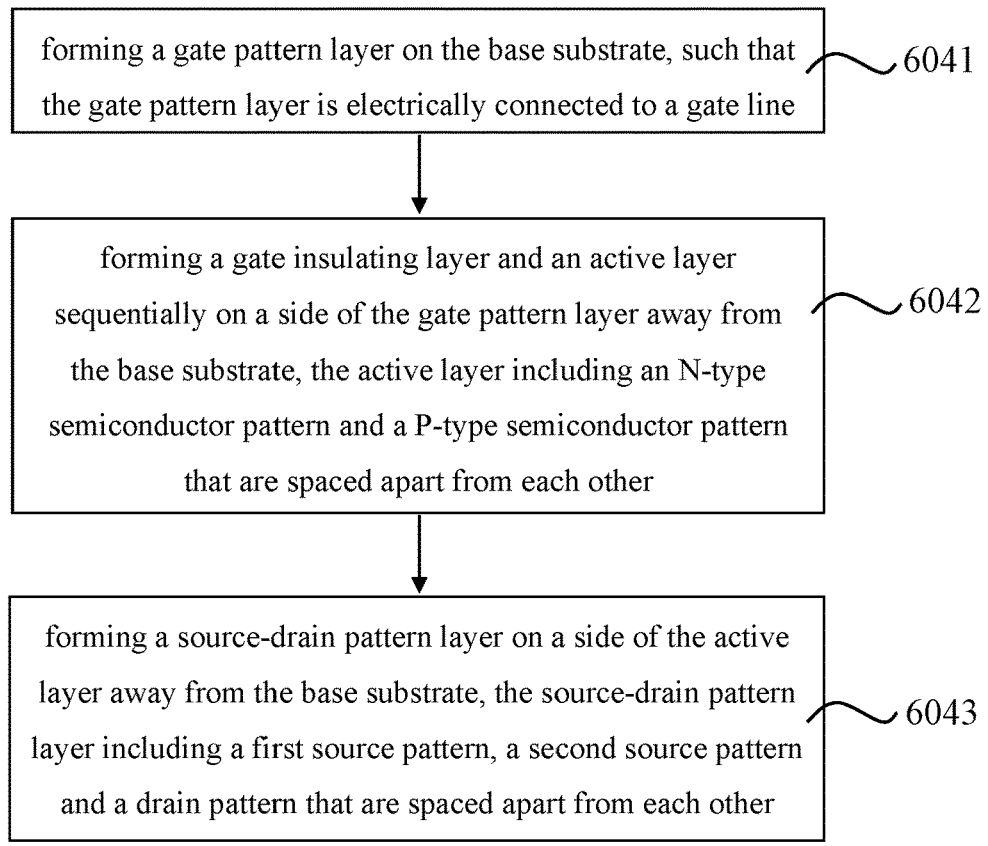
Figures 3, 6:
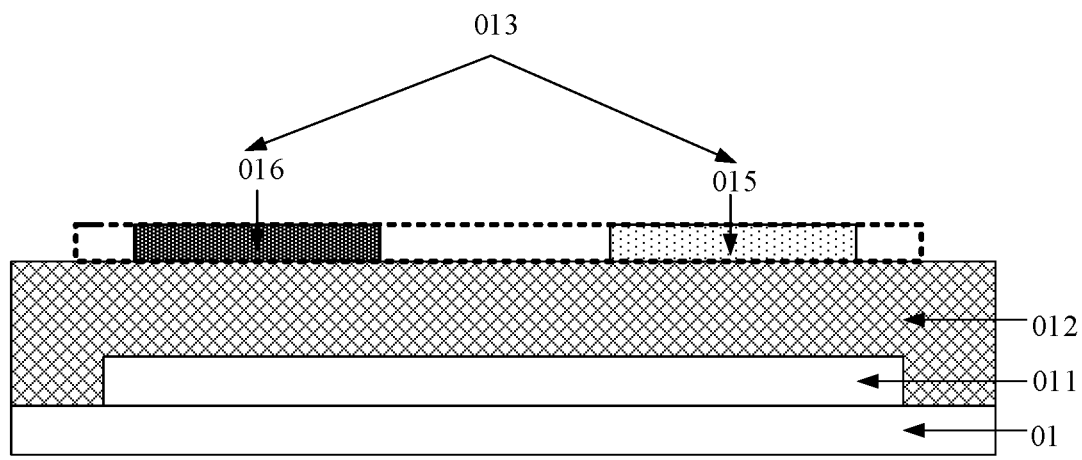
Figures 4, 6:
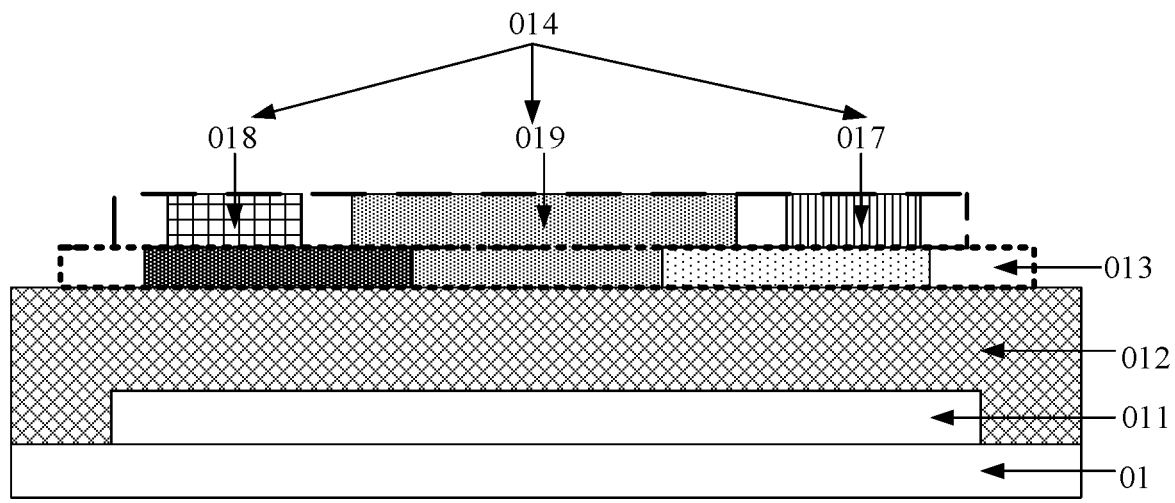

Embodiments of the present disclosure also provide a manufacturing method for a display substrate. Referring to FIG. 6-1, a flowchart of a manufacturing method for a display substrate according to an embodiment of the present disclosure is illustrated. As shown in FIG. 6-1, the manufacturing method may include the following steps.

Step 601: forming a plurality of gate lines on a base substrate.

In an embodiment of the present disclosure, a layer of conductive material with a certain thickness may be deposited on the base substrate to obtain a conductive material layer. After that, the conductive material layer is processed by a patterning process to obtain a plurality of gate lines.

For example, the patterning process can include photoresist coating, exposure, development, etching, and photoresist stripping. The conductive material used to form the gate lines may include, for example, molybdenum (Mo), copper (Cu), aluminum (Al), alloy materials thereof, and the like.

The plurality of gate lines formed on the base substrate may be arranged in an array or in other forms, and embodiments of the present disclosure are not limited in this regard.

Step 602: forming a film structure including a plurality of driving thin film transistors on a side of the plurality of gate lines away from the base substrate.

The driving thin film transistors in the film structure may be transistors for driving the pixel electrodes, and the driving thin film transistors may be formed using a patterning process.

Step 603: forming a plurality of conductive lines on a side of the film structure away from the base substrate.

Further, the plurality of conductive lines may be continuously formed on the base substrate on which the film structure is already formed by the method shown in the above step 601. An orthographic projection of each gate line on the base substrate overlaps with an orthographic projection of a corresponding conductive line on the base substrate. Moreover, the signal transmitted on each conductive line is inverted from the signal transmitted on the corresponding gate line. In this way, it is ensured that the coupling noise can be completely cancelled, thereby improving the touch precision of the display panel.

In an embodiment of the present disclosure, a mask for forming the plurality of gate lines may be employed, and the plurality of conductive lines may be continuously formed on the base substrate on which the film structure is already formed. In this way, the orthographic projection of the conductive lines on the base substrate can be completely coincident with the orthographic projection of the gate lines. That is, the width and the arrangement direction of each conductive line are exactly the same with that of the corresponding gate line. Moreover, the conductive lines may be formed by using a conductive material for forming the gate lines. For example, the conductive lines and the gate lines may both be formed of a metal material. Therefore, it can be ensured that the coupling noise generated by the signal transmitted on the corresponding gate line can be completely cancelled by the signal transmitted on the conductive line, thereby effectively improving the touch precision of the touch panel.

In summary, embodiments of the present disclosure provide a manufacturing method for a display substrate. Specifically, by disposing a plurality of conductive lines and a plurality of gate lines on the base substrate, and inverting the signal transmitted on each conductive line from the signal transmitted on the corresponding gate line, the coupling noise generated on the display panel due to the driving signal transmitted on the gate lines can be cancelled. In addition, the display substrate can also be applied to a touch display panel. In this case, since the coupling noise on the surface of the panel has been reduced, the interference of the touch signal received by the touch display panel due to the coupling noise can be effectively reduced, thereby improving the touch precision of the touch display panel.

Optionally, the manufacturing method further includes the following steps prior to step 603.

Step 604: forming a plurality of inverters on the base substrate.

Specifically, an input of each inverter can be connected to a gate line, and an output of each inverter can be connected to a conductive line that is formed later. In addition, the orthographic projections on the base substrate of the gate line and the conductive line that are connected to a same inverter overlap with each other.

In an embodiment of the present disclosure, the plurality of inverters may be formed on the base substrate using a patterning process. Alternatively, a plurality of inverter chips may be disposed directly on the base substrate, and the input of each inverter is connected to a gate line. After that, when the plurality of conductive lines are formed, each conductive line can be connected to the output of the corresponding inverter. Specifically, the number of inverters is equal to the number of gate lines, and inputs of the plurality of inverters are connected in one-to-one correspondence with the plurality of gate lines.

Referring to FIG. 3, since each inverter is composed of an N-type transistor TN and a P-type transistor TP, a plurality of sets of transistors can be formed on the base substrate when a plurality of inverters are used, wherein each set of transistors includes an N-type transistor and a P-type transistor. In the fabrication process, the gate of the N-type transistor TN and the gate of the P-type transistor TP may be connected to a same gate line, the first pole of the P-type transistor TP is connected to the first power line VGH, and the first pole of the N-type transistor TN is connected to the second power source line VGL. Further, after the conductive line is formed, the second pole of the N-type transistor TN and the second pole of the P-type transistor TP may be connected to a same conductive line. As an example, the first power line VGH is supplied with a first power signal of a first potential V1, and the second power line VGL is supplied with a second power signal of a second potential V2, wherein the first potential V1 is a higher potential relative to the second potential V2.

In an embodiment of the present disclosure, when the transistor in the inverter is a thin film transistor, the plurality of transistors may be formed in synchronization with formation of the driving thin film transistors for driving the pixel electrodes. That is, step 604 can be performed in synchronization with step 602, and thereby the manufacturing process can be simplified.

FIG. 6-2 is a flowchart for forming a set of transistors in the invertor on a base substrate according to an embodiment of the present disclosure. Referring to FIG. 6-2, the process for forming a set of transistors in the inverter in step 604 may include the following steps.

Step 6041: forming a gate pattern layer on the base substrate such that the gate pattern layer is electrically connected to a gate line.

Specifically, the gate pattern layer may be formed as gates of the N-type transistor TN and the P-type transistor TP. For the process of forming the gate pattern layer, reference may be made to step 601, and no further details are provided herein.

It should be noted that, in practical applications, the gate pattern layer and the gate lines may be disposed in the same layer. Therefore, the plurality of gate lines and the gate pattern layer can be formed synchronously on the base substrate.

Step 6042: forming a gate insulating layer and an active layer sequentially on a side of the gate pattern layer away from the base substrate, wherein the active layer includes an N-type semiconductor pattern and a P-type semiconductor pattern that are spaced apart from each other.

In an embodiment of the present disclosure, a layer of insulating material with a certain thickness may be continuously deposited on the base substrate on which the gate pattern layer is already formed, thereby obtaining a gate insulating film. After that, the gate insulating film may be baked to form a gate insulating layer. Alternatively, the insulating material may be silicon oxide, silicon nitride, or a mixed material of silicon oxide and silicon nitride.

Further, a layer of active film material (e.g., an amorphous silicon material) with a certain thickness may be deposited on a side of the gate insulating layer away from the base substrate to obtain an active thin film material layer. After that, the active thin film material layer is processed by a patterning process to obtain two active layer patterns that are spaced apart from each other. Next, each pattern is doped with N-type ions (such as phosphorus, arsenic) and P-type ions (such as boron, gallium) respectively, to obtain the N-type semiconductor pattern and the P-type semiconductor pattern. Thus, the N-type semiconductor pattern and the P-type semiconductor pattern constitute the active layer.

Illustratively, referring to FIG. 6-3, a schematic diagram of a structure after forming the gate insulating layer 012 and the active layer 013 sequentially on the side of the gate pattern layer 011 away from the base substrate 01 is shown. The active layer 013 includes the N-type semiconductor pattern 015 and the P-type semiconductor pattern 016 that are spaced apart from each other.

Step 6043: forming a source-drain pattern layer on a side of the active layer away from the base substrate, wherein the source-drain pattern layer includes a first source pattern, a second source pattern and a drain pattern that are spaced apart from each other.

Further, a layer of conductive material with a certain thickness may be deposited on a side of the active layer away from the base substrate to obtain a conductive thin film layer (e.g., a metal film layer). After that, the conductive film layer is processed by a patterning process to obtain a first source pattern, a second source pattern, and a drain pattern. Specifically, the first source pattern is electrically connected to a second power line in the display substrate, the second source pattern is electrically connected to the first power line in the display substrate, and the drain pattern is electrically connected to a conductive line. Furthermore, an orthographic projection of the first source pattern on the base substrate overlaps with an orthographic projection of the N-type semiconductor pattern on the base substrate, and an orthographic projection of the second source pattern on the base substrate overlaps with an orthographic projection of the P-type semiconductor pattern on the base substrate. Further, an orthographic projection of the drain pattern on the base substrate overlaps with the orthographic projection of the N-type semiconductor pattern on the base substrate and the orthographic projection of the P-type semiconductor pattern on the base substrate. Moreover, an orthographic projection of the gate pattern layer on the base substrate overlaps with the orthographic projection of the N-type semiconductor pattern on the base substrate and the orthographic projection of the P-type semiconductor pattern on the base substrate.

The first source pattern constitutes a first pole (e.g., a source) of the N-type transistor TN, the second source pattern constitutes a first pole (e.g., a source) of the P-type transistor TP, and the drain pattern constitutes second poles (e.g., drains) of the N-type transistor TN and the P-type transistor TP.

Illustratively, FIG. 6-4 shows a schematic diagram of a specific structure after the source-drain pattern layer 014 is formed on the side of the active layer 013 away from the base substrate 01, wherein the source-drain pattern layer 014 includes the first source pattern 017, the second source pattern 018, and the drain pattern 019 that are spaced apart from each other.

It should be noted that, in an embodiment of the present disclosure, each inverter 04 may be disposed at an end of the gate line 02 for connecting to the gate driving circuit, wherein the gate driving circuit is used to provide each gate line 02 with a driving signal. Therefore, the end of the gate line 02 for connecting to the gate driving circuit is also the input of the gate line 02. By disposing the inverter 04 at the input of the gate line 02, the inverter 04 can promptly output an inverted signal to the corresponding conductive line 03 when the gate driving circuit outputs a driving signal to the gate line 02. In this way, it is ensured that the coupling noise generated by the signal transmitted on the gate line 02 can be reduced timely.

It should be noted that, in the manufacturing method for a display substrate provided by embodiments of the present disclosure, the order of respective steps may be appropriately adjusted as needed, and some steps may be correspondingly added or cancelled according to actual conditions. Various modified methods can be easily conceived by those skilled in the art within the scope of technology disclosed in the present disclosure, and they are all included within the protection scope of the present disclosure.

In summary, embodiments of the present disclosure provide a manufacturing method for a display substrate. Specifically, by disposing a plurality of conductive lines and a plurality of gate lines on the base substrate, and inverting the signal transmitted on each conductive line from the signal transmitted on the corresponding gate line, the coupling noise generated on the display panel due to the driving signal transmitted on the gate lines can be cancelled. In addition, the display substrate can also be applied to a touch display panel. In this case, since the coupling noise on the surface of the panel has been reduced, the interference of the touch signal received by the touch display panel due to the coupling noise can be effectively reduced, thereby improving the touch precision of the touch display panel.

Embodiments of the present disclosure also provide a display panel. The display panel may include a display substrate such as that shown in FIG. 1, wherein the display substrate may include inverters such as that shown in any of FIG. 3 to FIG. 5. In an embodiment of the present disclosure, the display panel may be a touch display panel. Illustratively, the display panel can be any display panel including a product or component that has a display function and can be touched, such as a liquid crystal panel, a cell phone, a tablet, a notebook computer, a digital camera, etc.

Embodiments of the present disclosure also provide a display device. The display device may include the display panel as described above, wherein the display panel may include a display substrate as shown in FIG. 1. The display device may be any device having a display function, such as a mobile phone, a tablet, a notebook computer, a digital camera, etc.

The above description is only representative of the preferred embodiments of the present disclosure, and is not intended to limit the present disclosure. Any modifications, equivalent substitutions, improvements, etc. as made within the spirit and the principle of the present disclosure are intended to be included within the scope of the present disclosure.

The invention claimed is:

1. A display substrate, comprising:
a base substrate;
a plurality of gate lines on the base substrate;
a film structure on a side of the plurality of gate lines away from the base substrate;
a plurality of conductive lines on a side of the film structure away from the base substrate; and
a plurality of inverters,
wherein an orthographic projection of each gate line of the plurality of gate lines on the base substrate at least partially overlaps with a corresponding orthographic projection of a corresponding conductive line of the plurality of conductive lines on the base substrate, and
wherein corresponding first signals transmitted on corresponding ones of the plurality of conductive lines are inverted from corresponding second signals transmitted on corresponding ones of the plurality of gate lines,
wherein a corresponding input of each inverter of the plurality of inverters is connected to a corresponding gate line of the plurality of gate lines, a corresponding output of each inverter of the plurality of inverters is connected to a corresponding conductive line of the plurality of conductive lines, and a first orthographic projection of the corresponding gate line and a second orthographic projection of the corresponding conductive line that are connected to a same inverter of the plurality of inverters on the base substrate at least partially overlap with each other;
wherein each inverter of the plurality of inverters comprises an N-type transistor and a P-type transistor, a gate of the N-type transistor and a gate of the P-type transistor of each of the plurality of inverters are connected to a same respective gate line of the plurality of gate lines, a first pole of the P-type transistor is connected to a first power line, a first pole of the N-type transistor is connected to a second power line, a second pole of the N-type transistor and a second pole of the P-type transistor of each of the plurality of inverters are connected to a same respective conductive line of the plurality of conductive lines, the first power line is configured to be supplied with a first power signal of a first potential, and the second power line is configured to be supplied with a second power signal of a second potential, wherein the first potential is a higher potential relative to the second potential.

2. The display substrate according to claim 1, wherein the first orthographic projection of a corresponding gate line on the base substrate coincides with the second orthographic projection of the corresponding conductive line on the base substrate.

3. The display substrate according to claim 1, wherein the N-type transistor and the P-type transistor are thin film transistors.

4. The display substrate according to claim 3, wherein each inverter comprises:
a gate pattern layer, a gate insulating layer, an active layer and a source-drain pattern layer on the base substrate,
wherein the gate pattern layer is configured to serve as gates of the N-type transistor and the P-type transistor,
wherein the active layer comprises an N-type semiconductor pattern and a P-type semiconductor pattern that are spaced apart from each other,
wherein the source-drain pattern layer comprises a first source pattern, a second source pattern and a drain pattern that are spaced apart from each other,
wherein the first source pattern is configured to serve as the first pole of the N-type transistor, the second source pattern is configured to serve as the first pole of the P-type transistor, and the drain pattern is configured to serve as the second poles of the N-type transistor and the P-type transistor, and
wherein the gate pattern layer is electrically connected to a corresponding gate line of the plurality of gate lines, the first source pattern is electrically connected to the second power line, the second source pattern is electrically connected to the first power line, and the drain pattern is electrically connected to a corresponding conductive line of the plurality of conductive lines.

5. The display substrate according to claim 4, wherein an orthographic projection of the first source pattern on the base substrate at least partially overlaps with an orthographic projection of the N-type semiconductor pattern on the base substrate,
wherein an orthographic projection of the second source pattern on the base substrate at least partially overlaps with an orthographic projection of the P-type semiconductor pattern on the base substrate,
wherein an orthographic projection of the drain pattern on the base substrate at least partially overlaps with the orthographic projection of the N-type semiconductor pattern on the base substrate and the orthographic projection of the P-type semiconductor pattern on the base substrate, and
wherein an orthographic projection of the gate pattern layer on the base substrate at least partially overlaps with the orthographic projection of the N-type semiconductor pattern on the base substrate and the orthographic projection of the P-type semiconductor pattern on the base substrate.

6. The display substrate according to claim 1, wherein each inverter is at an end of the corresponding gate line and configured to connect to a corresponding gate driving circuit.

7. The display substrate according to claim 1, wherein the film structure comprises a plurality of driving thin film transistors.

8. The display substrate of claim 1, further comprising:
a driving circuit for the plurality of conductive lines, wherein the driving circuit is configured to transmit on each conductive line a corresponding first signal inverted from a second signal transmitted on the corresponding gate line.

9. A display panel, comprising:
the display substrate according to claim 1.

10. A display device, comprising:
the display panel according to claim 9.

11. A manufacturing method for a display substrate, comprising:
forming a plurality of gate lines on a base substrate;
forming a film structure on a side of the plurality of gate lines away from the base substrate;
forming a plurality of conductive lines on a side of the film structure away from the base substrate; and
forming a plurality of inverters on the base substrate,
wherein an orthographic projection of each gate line of the plurality of gate lines on the base substrate at least partially overlaps with a corresponding orthographic projection of a corresponding conductive line of the plurality of conductive lines on the base substrate,
wherein corresponding first signals transmitted on each conductive line of the plurality of conductive lines are inverted from corresponding second signals transmitted on corresponding ones of the plurality of gate lines,
wherein a corresponding input of each inverter of the plurality of inverters is connected to a corresponding gate line of the plurality of gate lines, a corresponding output of each inverter of the plurality of inverters is connected to a corresponding conductive line of the plurality of conductive lines, and a first orthographic projection of the corresponding gate line and a second orthographic projection of the corresponding conductive line that are connected to a same inverter of the plurality of inverters on the base substrate at least partially overlap with each other,
wherein each inverter of the plurality of inverters comprises an N-type transistor and a P-type transistor, and the forming the plurality of inverters on the base substrate comprises forming a plurality of sets of transistors on the base substrate, wherein each set of the plurality of sets of transistors comprises an N-type transistor and a P-type transistor,
wherein a gate of the N-type transistor and a gate of the P-type transistor of each of the plurality of inverters are connected to a same respective gate line of the plurality of gate lines, a first pole of the P-type transistor is connected to a first power line, a first pole of the N-type transistor is connected to a second power line, a second pole of the N-type transistor and a second pole of the P-type transistor of each of the plurality of inverters are connected to a same respective conductive line of the plurality of conductive lines, the first power line is configured to be supplied with a first power signal of a first potential, and the second power line is configured to be supplied with a second power signal of a second potential, wherein the first potential is a higher potential relative to the second potential.

12. The manufacturing method according to claim 11, wherein the forming the plurality of conductive lines on the side of the film structure away from the base substrate comprises:
forming the plurality of conductive lines on the side of the film structure away from the base substrate by using a mask for forming the plurality of gate lines.

13. The manufacturing method according claim 11, wherein the N-type transistor and the P-type transistor are thin film transistors, and wherein the forming the plurality of sets of transistors on the base substrate comprises:

forming the plurality of sets of transistors in synchronization with formation of driving thin film transistors.

14. The manufacturing method according to claim 13, wherein each set of transistors is formed by operations comprising:

forming a gate pattern layer on the base substrate, such that the gate pattern layer is electrically connected to a gate line and serves as gates of the N-type transistor and the P-type transistor;

forming a gate insulating layer and an active layer sequentially on a side of the gate pattern layer away from the base substrate, wherein the active layer comprises an N-type semiconductor pattern and a P-type semiconductor pattern that are spaced apart from each other; and forming a source-drain pattern layer on a side of the active layer away from the base substrate, wherein the source-drain pattern layer comprises a first source pattern, a second source pattern and a drain pattern that are spaced apart from each other, wherein the first source pattern is electrically connected to the second power line, the second source pattern is electrically connected to the first power line, and the drain pattern is electrically connected to a conductive line, wherein the first source pattern is formed to serve as a first pole of the N-type transistor, the second source pattern is formed to serve as a first pole of the P-type transistor, and the drain pattern is formed to serve as second poles of the N-type transistor and the P-type transistor.

15. The manufacturing method according to claim 14, wherein the first source pattern is formed such that an orthographic projection thereof on the base substrate at least partially overlaps with an orthographic projection of the N-type semiconductor pattern on the base substrate, wherein the second source pattern is formed such that an orthographic projection thereof on the base substrate at least partially overlaps with an orthographic projection of the P-type semiconductor pattern on the base substrate, wherein the drain pattern is formed such that an orthographic projection thereof on the base substrate at least partially overlaps with the orthographic projection of the N-type semiconductor pattern on the base substrate and the orthographic projection of the P-type semiconductor pattern on the base substrate, and wherein the gate pattern layer is formed such that an orthographic projection thereof on the base substrate at least partially overlaps with the orthographic projection of the N-type semiconductor pattern on the base substrate and the orthographic projection of the P-type semiconductor pattern on the base substrate.

16. The manufacturing method according to claim 11, further comprising:

providing a driving circuit for the plurality of conductive lines, wherein each conductive line of the plurality of conductive lines transmits a first signal that is inverted from a second signal transmitted on the corresponding gate line of the plurality of gate lines.

* * * * *